(12) United States Patent
Park et al.

(10) Patent No.: US 12,550,739 B2
(45) Date of Patent: Feb. 10, 2026

(54) SEMICONDUCTOR PACKAGE INCLUDING A METAL PLATE AND PACKAGE-ON-PACKAGE HAVING THE SAME

(71) Applicant: Samsung Electronics Co., Ltd., Suwon-si (KR)

(72) Inventors: Junwoo Park, Suwon-si (KR); Yongkwan Lee, Suwon-si (KR); Seunghwan Kim, Suwon-si (KR); Jungjoo Kim, Suwon-si (KR); Jongwan Kim, Suwon-si (KR); Taejun Jeon, Suwon-si (KR); Junhyeung Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 18/104,650

(22) Filed: Feb. 1, 2023

(65) Prior Publication Data

US 2023/0378094 A1    Nov. 23, 2023

(30) Foreign Application Priority Data

May 19, 2022    (KR) ......................... 10-2022-0061651

(51) Int. Cl.
*H01L 23/00* (2006.01)
*H01L 23/31* (2006.01)
(Continued)

(52) U.S. Cl.
CPC ........ *H01L 23/562* (2013.01); *H01L 23/3128* (2013.01); *H01L 23/49811* (2013.01);
(Continued)

(58) Field of Classification Search
CPC .............. H01L 23/562; H01L 23/3128; H01L 23/49811; H01L 23/5383; H01L 23/5385;
(Continued)

(56) References Cited

U.S. PATENT DOCUMENTS

| 9,252,031 B2 | 2/2016 | Im et al. |
| 9,481,572 B2 | 11/2016 | Jacobs |

(Continued)

FOREIGN PATENT DOCUMENTS

| CN | 103715152 A | * | 4/2014 |
| KR | 1020160122437 A | | 10/2016 |
| KR | 101831643 B1 | | 2/2018 |

*Primary Examiner* — Duy T Nguyen
(74) *Attorney, Agent, or Firm* — Muir Patent Law, PLLC

(57) ABSTRACT

A semiconductor package includes a support wiring structure, a semiconductor chip on the support wiring structure, a connection structure on the support wiring structure and spaced apart from the semiconductor chip in a horizontal direction, an interposer including a central portion and an outer portion and having a recess portion provided on a lower surface of the central portion facing the semiconductor chip, wherein the central portion is on the semiconductor chip and the connection structure is connected to the outer portion, and a metal plate disposed along a portion of a surface of the recess portion inside the interposer, wherein the metal plate extends along a side surface of the outer portion of the interposer and the lower surface of the central portion of the interposer, and the metal plate has a cavity passing through a vicinity of a center of the metal plate planarly.

20 Claims, 10 Drawing Sheets

(51) Int. Cl.
*H01L 23/498* (2006.01)
*H01L 23/538* (2006.01)
*H10B 80/00* (2023.01)

(52) U.S. Cl.
CPC ...... *H01L 23/5383* (2013.01); *H01L 23/5385* (2013.01); *H01L 23/5386* (2013.01); *H10B 80/00* (2023.02); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ..... H01L 23/5386; H01L 24/16; H01L 24/32; H01L 24/73; H01L 2224/16227; H01L 2224/32225; H01L 2224/73204; H01L 23/13; H01L 2224/81; H01L 24/83; H01L 25/105; H01L 23/49816; H01L 24/97; H01L 24/15; H01L 25/0657; H01L 25/18; H01L 2224/97; H10B 80/00; H05K 1/181

USPC ........................................................ 257/668
See application file for complete search history.

(56) References Cited

U.S. PATENT DOCUMENTS

| | | | |
|---|---|---|---|
| 9,609,751 | B2 | 3/2017 | Jomaa et al. |
| 10,431,536 | B2 | 10/2019 | Kim et al. |
| 10,756,033 | B2 | 8/2020 | Dalmia et al. |
| 11,164,754 | B2 | 11/2021 | Tsai et al. |
| 2005/0104196 | A1* | 5/2005 | Kashiwazaki ...... H01L 25/0657 |
| | | | 257/E23.101 |
| 2011/0303936 | A1* | 12/2011 | Wu ...................... H10H 20/857 |
| | | | 438/27 |
| 2015/0084170 | A1* | 3/2015 | Im ....................... H01L 23/3677 |
| | | | 438/107 |
| 2018/0145061 | A1* | 5/2018 | Jeong .................. H01L 23/5383 |
| 2020/0126812 | A1* | 4/2020 | Jeng ........................ H01L 24/33 |
| 2020/0321301 | A1* | 10/2020 | Mitarai ............... H01L 23/3107 |
| 2021/0407911 | A1* | 12/2021 | Park ........................ H01L 24/24 |

* cited by examiner

SEMICONDUCTOR PACKAGE INCLUDING A METAL PLATE AND PACKAGE-ON-PACKAGE HAVING THE SAME

CROSS-REFERENCE TO RELATED APPLICATION

This application is based on and claims priority under 35 U.S.C. § 119 to Korean Patent Application No. 10-2022-0061651, filed on May 19, 2022, in the Korean Intellectual Property Office, the disclosure of which is incorporated by reference herein in its entirety.

BACKGROUND

The inventive concept relates to a semiconductor package and a package-on-package having the same, and more particularly, to a fan-out semiconductor package and a package-on-package having the same.

In accordance with the rapid development of the electronics industry and the needs of users, electronic devices have become smaller and lighter, and accordingly, high integration of semiconductor devices, which are core components of electronic devices, is required. In addition, as mobile products have advanced, miniaturization and multi-functionality are required in conjunction.

Accordingly, in order to provide a multifunctional semiconductor package, a package-on-package (PoP) type semiconductor package in which a semiconductor package having a different function is stacked on one semiconductor package has been developed.

SUMMARY

The inventive concept provides a semiconductor package that may be located at a lower portion, while providing structural reliability between upper and lower portions when another semiconductor package is stacked thereon to prevent cracks therein, and a package-on-package type semiconductor package having the same.

The inventive concept also provides a semiconductor package having improved heat dissipation capability and improved reliability, and a package-on-package type semiconductor package having the same.

According to an aspect of the inventive concept, there is provided a semiconductor package including a support wiring structure, a semiconductor chip disposed on the support wiring structure, a connection structure disposed on the support wiring structure and spaced apart from the semiconductor chip in a horizontal direction, an interposer including a central portion disposed on the semiconductor chip and an outer portion to which the connection structure is attached, and having a recess portion provided on a lower surface of the central portion facing the semiconductor chip, and a metal plate disposed along a portion of a surface of the recess portion inside the interposer, wherein the metal plate extends along a side surface of the outer portion of the interposer and the lower surface of the central portion of the interposer, and the metal plate has a cavity passing through a vicinity of a center of the metal plate planarly.

According to another aspect of the inventive concept, there is provided a semiconductor package including a support wiring structure, a semiconductor chip disposed on the support wiring structure, a connection structure disposed on the support wiring structure and spaced apart from the semiconductor chip in a horizontal direction, an interposer including a central portion disposed on the semiconductor chip and an outer portion to which the connection structure is attached, and having a recess portion provided on a lower surface of the central portion facing the semiconductor chip, and a metal plate disposed along a portion of a surface of the recess portion inside the interposer, wherein the interposer includes at least one base insulating layer, a plurality of upper surface pads and a plurality of lower surface pads respectively disposed on upper and lower surfaces of the at least one base insulating layer, an upper surface solder resist layer covering the upper surface of the at least one base insulating layer and exposing the plurality of upper surface pads, and a lower surface solder resist layer covering a portion of the lower surface of the at least one base insulating layer and exposing the plurality of lower surface pads, wherein the metal plate has a cavity passing through a vicinity of a center of the metal plate planarly, the metal plate extends along a side surface of the outer portion of the interposer and the lower surface of the central portion of the interposer, and a highest surface of a concavo-convex surface of the metal plate is disposed on a vertical level that is the same as a vertical level of a lower surface of the central portion of the interposer.

According to another aspect of the inventive concept, there is provided a package-on-package including a first support wiring structure, a first semiconductor chip disposed on the first support wiring structure, a first connection structure disposed on the first support wiring structure and spaced apart from the first semiconductor chip in a horizontal direction, an interposer including a central portion disposed on the first semiconductor chip and an outer portion to which the first connection structure is attached, and having a recess portion provided on a lower surface of the central portion facing the first semiconductor chip, an insulating filler filling a portion between the first support wiring structure and the interposer and contacting the first semiconductor chip and the first connection structure, a metal plate disposed along a portion of a surface of the recess portion inside the interposer, a second connection structure disposed on an outer portion of the interposer, a second support wiring structure disposed on the interposer through the second connection structure, and a second semiconductor chip disposed on the second support wiring structure, wherein the interposer has a recess portion provided on a lower surface of the central portion of the interposer facing the semiconductor chip, the metal plate extends along a side surface of the outer portion of the interposer and a lower surface of the central portion of the interposer, a highest surface of a concavo-convex surface of the metal plate is disposed on a vertical level that is the same as a vertical level of a lower surface of the central portion of the interposer, and a portion of the upper surface of the recess portion is not in contact with the metal plate.

BRIEF DESCRIPTION OF THE DRAWINGS

Embodiments will be more clearly understood from the following detailed description taken in conjunction with the accompanying drawings in which like numerals refer to like elements throughout. In the drawings.

DETAILED DESCRIPTION OF THE EMBODIMENTS

Figure 1A:
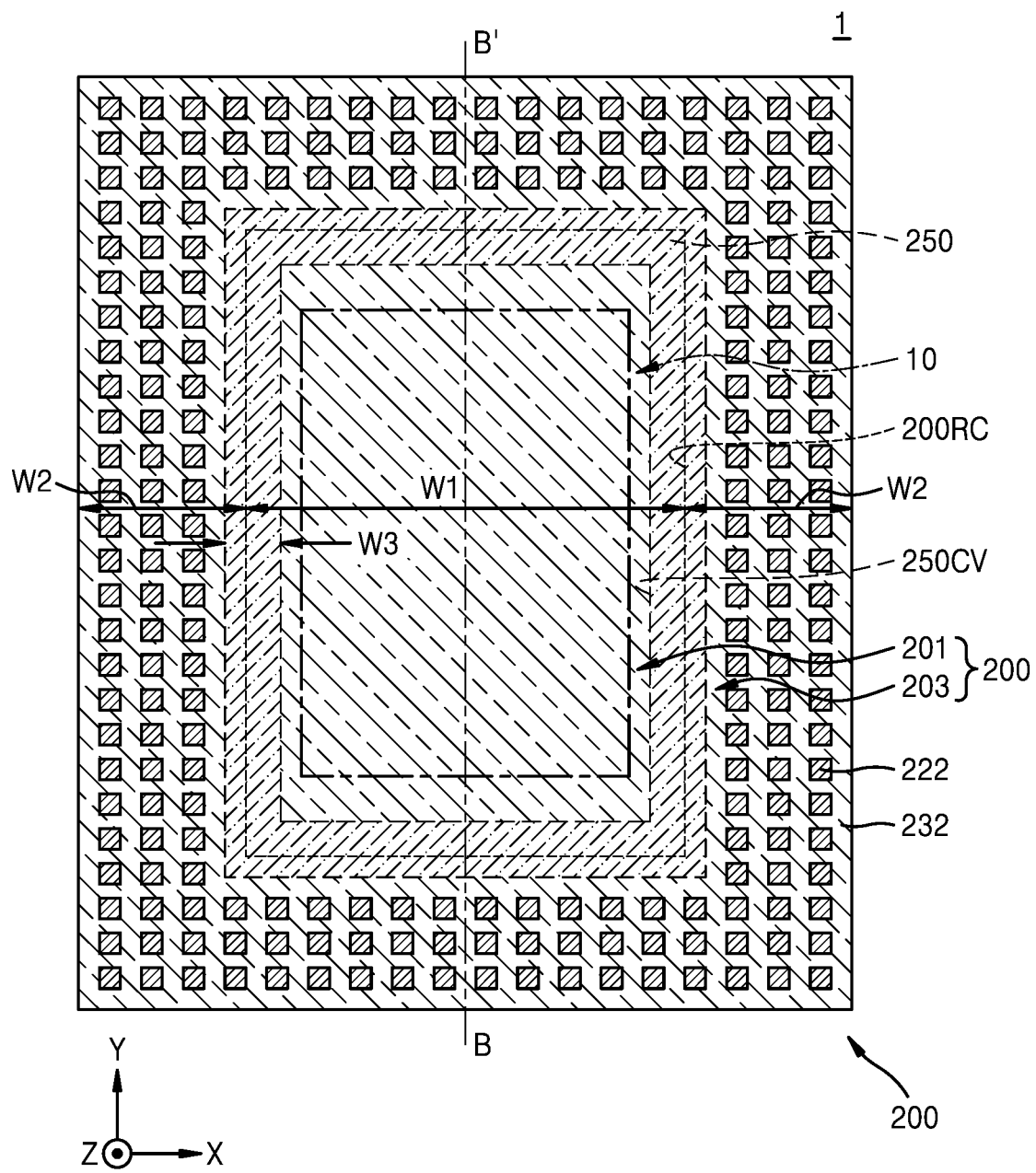
FIG. 1A is a top view of a semiconductor package according to an example embodiment.
Figure 1B:
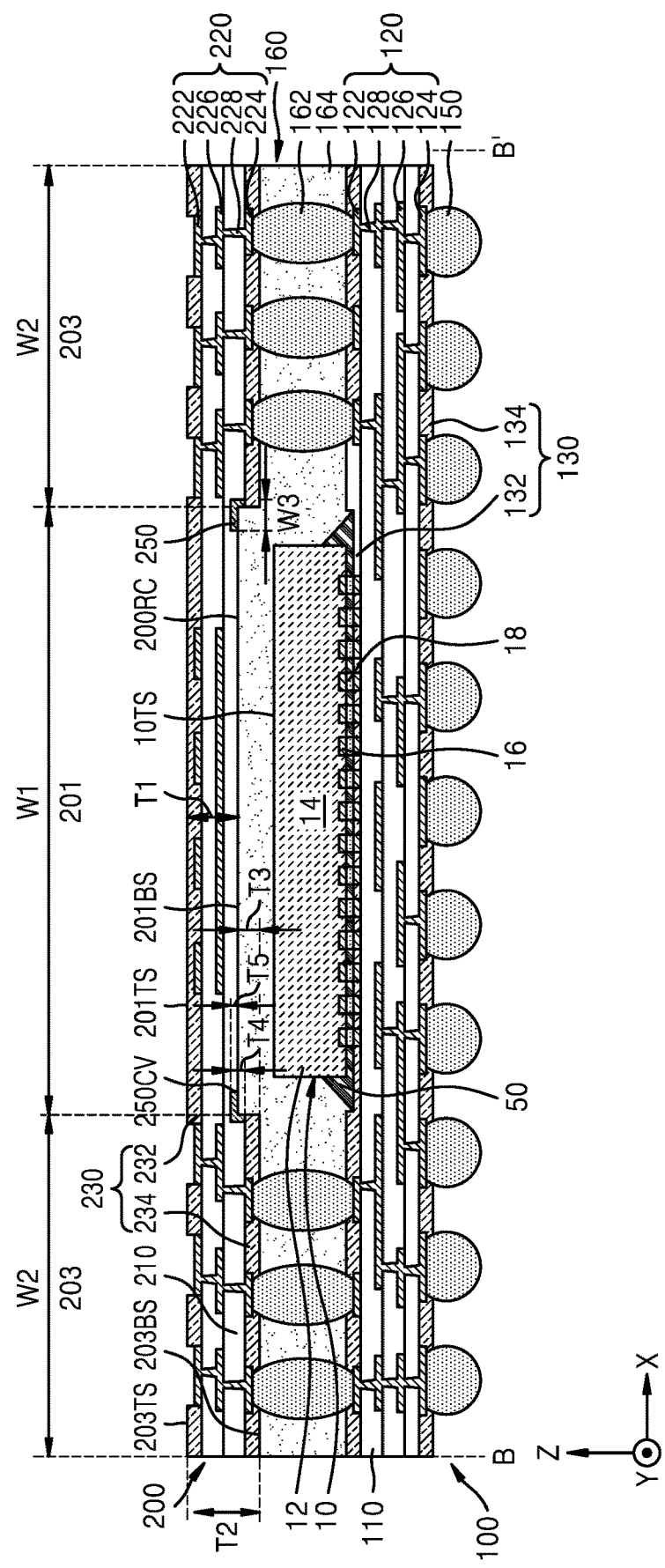
FIG. 1B is a cross-sectional view of the semiconductor package of FIG. 1A according to an example embodiment.

FIG. 1A is a top view of a semiconductor package 1 according to example embodiments, and FIG. 1B is a cross-sectional view of the semiconductor package 1 according to example embodiments, taken along line B-B' of FIG. 1A. For convenience of description, illustration of a plurality of second upper surface pads 222 disposed on a recess portion 200RC of an interposer 200 is omitted in FIG. 1A.

Referring to FIGS. 1A and 1B together, the semiconductor package 1 may include a support wiring structure 100, an expanded layer 160 disposed on the support wiring structure 100, a semiconductor chip 10 disposed in the expanded layer 160, and an interposer 200 disposed on the expanded layer 160. The expanded layer 160 may surround the semiconductor chip 10. Although the semiconductor package 1 is illustrated as including one semiconductor chip 10 in FIGS. 1A and 1B, this is an example and the inventive concept is not limited thereto. In some embodiments, the semiconductor package 1 may include a plurality of semiconductor chips 10.

The semiconductor package 1 may be a fan out semiconductor package in which each of a horizontal width and a horizontal area of the support wiring structure 100 and a horizontal width and a horizontal area of the interposer 200 has a value greater than a horizontal width and a horizontal area of a footprint configured by the semiconductor chip 10. For example, when the semiconductor package 1 includes one semiconductor chip 10, each of the horizontal width and horizontal area of the support wiring structure 100 and the horizontal width and horizontal area of the interposer 200 may have a value greater than the horizontal width and horizontal area of one semiconductor chip 10. In some embodiments, the horizontal widths and the horizontal areas of the support wiring structure 100 and the interposer 200 may have the same value. In some embodiments, side surfaces of the support wiring structure 100, the expanded layer 160, and the interposer 200 corresponding to each other may be coplanar.

The support wiring structure 100 may also be referred to as a lower wiring structure or a first wiring structure, and the interposer 200 may also be referred to as an upper wiring structure or a second wiring structure.

The support wiring structure 100 may be, for example, a printed circuit board (PCB), a ceramic substrate, a wafer for manufacturing a package, or an interposer. In some embodiments, the support wiring structure 100 may be a multi-layer PCB. When the support wiring structure 100 is a PCB, the support wiring structure 100 may also be referred to as a support PCB, a lower PCB, or a first PCB.

The support wiring structure 100 may include at least one first base insulating layer 110 and a plurality of first wiring patterns 120. The first base insulating layer 110 may include at least one material selected from a phenol resin, an epoxy resin, and a polyimide. The first base insulating layer 110 may include, for example, frame retardant 4 (FR-4), tetrafunctional epoxy, polyphenylene ether, epoxy/polyphenylene oxide, bismaleimide triazine (BT), thermount, cyanate ester, polyimide, and liquid crystal polymer.

The first wiring patterns 120 may include a first upper surface wiring pattern disposed on an upper surface of at least one first base insulating layer 110 and including a plurality of first upper surface pads 122, a first lower surface wiring pattern disposed on a lower surface of the at least one first base insulating layer 110 and including a plurality of first lower surface pads 124, and a plurality of conductive vias 128 passing through the at least one first base insulating layer 110 and electrically connecting the first wiring patterns 120 disposed on different wiring layers to each other.

In some embodiments, when the support wiring structure 100 includes a plurality of first base insulating layers 110, the first wiring pattern 120 may further include a first internal wiring pattern 126 disposed to form a layer between two first base insulating layers 110 adjacent to each other. Each of upper and lower ends of the plurality of first conductive vias 128 may contact any one of a portion of the first upper surface wiring pattern, a portion of the first lower surface wiring pattern, or a portion of the first internal wiring pattern 126. The first wiring pattern 120 may include copper, nickel, stainless steel, or beryllium copper. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The wiring layer refers to an electrical path extending on a plane. The support wiring structure 100 may have wiring layers on the upper surface and the lower surface of the at least one first base insulating layer 110. Accordingly, the support wiring structure 100 may have more wiring layers than the number of the first base insulating layers 110.

The upper surface of the at least one first base insulating layer 110 and the lower surface of the at least one first base insulating layer 110 respectively refer to an upper surface and a lower surface of the first base insulating layer 110 when the support wiring structure 100 has one first base insulating layer 110, and respectively refer to an upper surface of the first base insulating layer 110 at the uppermost end among a plurality of first base insulating layers 110 and a lower surface of the first base insulating layer 110 at the lowermost end among the plurality of first base insulating layers 110, when the support wiring structure 100 includes a plurality of first base insulating layers 110.

The support wiring structure 100 may further include a first solder resist layer 130 disposed on an upper surface and a lower surface thereof. The first solder resist layer 130 may include a first upper surface solder resist layer 132 covering the upper surface of at least one first base insulating layer 110 and exposing the first upper surface pad 122 of the first upper surface wiring pattern and a first lower surface solder resist layer 134 covering the lower surface of the at least one first base insulating layer 110 and exposing the first lower surface pad 124 of the first lower surface wiring pattern.

In some embodiments, the first lower surface solder resist layer 134 covering the lower surface of the at least one first base insulating layer 110 may be formed, while the first upper surface solder resist layer 132 covering the upper surface of the at least one first base insulating layer 110 may not be formed.

In some embodiments, each of the first upper surface solder resist layer 132 and the first lower surface solder resist layer 134 may be formed by applying a solder mask insulating ink to the upper surface and the lower surface of at least one first base insulating layer 110 by a screen-printing method or inkjet printing and then curing the solder mask insulating ink with heat, ultraviolet (UV), or infrared (IR).

In some other embodiments, each of the first upper surface solder resist layer 132 and the first lower surface solder resist layer 134 may be formed by applying a photo-imageable solder resist to the entire upper surface and lower surface of at least one first base insulating layer 110 through a screen-printing method or a spray coating method or bonding a film type solder resist material by a laminating method, removing an unnecessary portion through exposure and development, and then curing a resultant structure with heat, UV, or IR.

The semiconductor chip 10 may include a semiconductor substrate 12 having a semiconductor device 14 formed on an active surface thereof and a plurality of chip connection pads 16 disposed on the active surface of the semiconductor substrate 12. In some embodiments, when the semiconductor package 1 is a lower package of a package-on-package (PoP), a semiconductor package 1, the semiconductor chip 10, the semiconductor substrate 12, the semiconductor device 14, and the chip connection pad 16 may be referred to as a first semiconductor package, a first semiconductor chip, a first semiconductor substrate, a first semiconductor device, and a first chip connection pad, respectively, or a lower semiconductor package, a lower semiconductor chip, a lower semiconductor substrate, a lower semiconductor device, and a lower chip connection pad, respectively.

The semiconductor substrate 12 may include, for example, a semiconductor material such as silicon (Si). Alternatively, the semiconductor substrate 12 may include a semiconductor device such as germanium (Ge) or a compound semiconductor such as silicon carbide (SiC), gallium arsenide (GaAs), indium arsenide (InAs), and indium phosphide (InP). The semiconductor substrate 12 may include a conductive region, for example, a well doped with impurities. The semiconductor substrate 12 may have various device isolation structures such as a shallow trench isolation (STI) structure.

The semiconductor device 14 including various types of a plurality of individual devices may be formed on the active surface of the semiconductor substrate 12. The individual devices may include various microelectronic devices, for example, a metal-oxide-semiconductor field effect transistor (MOSFET), such as a complementary metal-insulator-semiconductor transistor (CMOS), a system large scale integration (LSI), an image sensor, such as a CMOS imaging sensor (CIS), a micro-electro-mechanical system (MEMS), an active device, a passive device, and the like. The individual devices may be electrically connected to the conductive region of the semiconductor substrate 12. The semiconductor device 14 may further include at least two of the individual devices, or a conductive wiring or a conductive plug electrically connecting the individual devices to the conductive region of the semiconductor substrate 12. In addition, each of the individual devices may be electrically isolated from other neighboring individual devices by an insulating layer.

The semiconductor chip 10 may include, for example, a central processing unit (CPU) chip, a graphic processing unit (GPU) chip, or an application processor (AP) chip. In some embodiments, when the semiconductor package 1 includes a plurality of semiconductor chips 10, some of the semiconductor chips 10 may include, for example, dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The semiconductor chip 10 may be mounted on the support wiring structure 100 in a flip-chip manner. For example, the semiconductor chip 10 may be mounted on the support wiring structure 100 such that the active surface of the semiconductor substrate 12 faces the support wiring structure 100.

The chip connection pads 16 of the semiconductor chip 10 electrically connected to the semiconductor device 14 may be electrically connected to the support wiring structure 100. A plurality of chip connection terminals 18 may be disposed between some of the first upper surface pads 122 and the chip connection pads 16 to electrically connect the semiconductor chip 10 to the first wiring patterns 120 of the support wiring structure 100. The plurality of chip connection terminals 18 may contact upper surfaces of some of the first upper surface pads 122 and lower surfaces of the chip connection pads 16. For example, the plurality of chip connection terminals 18 may be solder balls or bumps.

In some embodiments, an underfill layer 50 surrounding the chip connection terminals 18 may be interposed between the semiconductor chip 10 and the support wiring structure 100. The underfill layer 50 may include, for example, an epoxy resin formed by a capillary under-fill method. In some embodiments, the underfill layer 50 may cover at least a portion of a side surface of the semiconductor chip 10. For example, the underfill layer 50 may contact side and bottom surfaces of the semiconductor chip 10, side surfaces of the plurality of chip connection terminals 18, and an upper surface of the first upper surface solder resist layer 132.

The expanded layer 160 may include a plurality of connection structures 162 and a filling member 164 surrounding the connection structures 162 and the semiconductor chip 10. The connection structures 162 may be spaced apart from the semiconductor chip 10 in a horizontal direction (an X direction and/or a Y direction), and may be disposed around the semiconductor chip 10. The connection structures 162 may pass through the filling member 164 to electrically connect the support wiring structure 100 to the interposer 200. An upper end and a lower end of each of the connection structures 162 may be in contact with and connected to any one of the second lower surface pads 224 of the interposer 200 and any one of the first upper surface pads 122 of the support wiring structure 100, respectively. Thicknesses in the vertical direction (the Z direction) of the connection structures 162 may be greater than a thickness in the vertical direction of the filling member 164.

Each of the connection structures 162 may include a through mold via (TMV), conductive solders, conductive pillars, or at least one conductive bump. In some embodiments, each of the connection structures 162 may be formed by reflowing a lower portion formed to be attached to any one of the first upper surface pads 122 of the support wiring structure 100 and an upper portion formed to be attached to any one of the second lower surface pads 224 of the interposer 200 with heat to be integrally soldered. The filling member 164 may include, for example, an epoxy mold compound (EMC).

The interposer 200 may be, for example, a PCB, a ceramic substrate, or a wafer for manufacturing a package. In some embodiments, the interposer 200 may be a multi-layer PCB. When the interposer 200 is a PCB, the interposer 200 may also be referred to as a cover PCB, an upper PCB, or a second PCB.

The interposer 200 may include at least one second base insulating layer 210 and a plurality of second wiring patterns 220. The second base insulating layer 210 may include at least one material selected from phenol resin, epoxy resin, and polyimide.

The second wiring patterns 220 may include a second upper surface wiring pattern disposed on an upper surface of at least one second base insulating layer 210 and including a plurality of second upper surface pads 222, a second lower surface wiring pattern disposed on a lower surface of the at least one second base insulating layer 210 and including a plurality of second lower surface pads 224, and a plurality of conductive vias 228 passing through the at least one second base insulating layer 210 and electrically connecting the second wiring patterns 220 disposed on different wiring layers to each other.

In some embodiments, when the interposer 200 includes a plurality of second base insulating layers 210, the second wiring pattern 220 may further include a second internal wiring pattern 226 disposed to form a layer between two second base insulating layers 210 adjacent to each other, the second internal wiring pattern 226 being substantially the same as the first internal wiring pattern 126. Each of upper and lower ends of the plurality of second conductive vias 228 may contact any one of a portion of the second upper surface wiring pattern, a portion of the second lower surface wiring pattern, or a portion of the second internal wiring pattern. The second wiring pattern 220 may include copper, nickel, stainless steel, or beryllium copper.

Although FIG. 1B illustrates that the support wiring structure 100 has four wiring layers and the interposer 200 has three wiring layers, this is only an example and the inventive concept is not limited thereto. In some embodiments, the number of wiring layers included in the support wiring structure 100 may be greater than the number of wiring layers included in the interposer 200.

The interposer 200 may further include second solder resist layers 230 disposed on upper and lower surfaces thereof. The second solder resist layer 230 may include a second upper surface solder resist layer 232 covering an upper surface of the at least one second base insulating layer 210 and exposing the second upper surface pad 222 of the second upper surface wiring pattern and a second lower surface solder resist layer 234 covering a portion of the lower surface of the at least one second base insulating layer 210 and exposing the second lower surface pad 224 of the second lower surface wiring pattern. As is described below, the second lower surface solder resist layer 234 may be disposed only at an outer portion 203 of the interposer 200.

In some embodiments, each of the second upper surface solder resist layer 232 and the second lower surface solder resist layer 234 may be formed by applying a solder mask insulating ink to the upper surface and the lower surface of at least one second base insulating layer 210 by a screen-printing method or inkjet printing and then curing the solder mask insulating ink with heat, UV, or IR.

In some other embodiments, each of the second upper surface solder resist layer 232 and the second lower surface solder resist layer 234 may be formed by applying a photo-imageable solder resist to the entire upper surface and lower surface of at least one second base insulating layer 210 through a screen-printing method or a spray coating method or bonding a film type solder resist material by a laminating method, removing an unnecessary portion through exposure and development, and then curing a resultant structure with heat, UV, or IR.

Although only the first upper surface pad 122 of the first upper surface wiring pattern is illustrated, only the first lower surface pad 124 of the first lower surface wiring pattern is illustrated, only the second upper surface pad 222 of the second upper surface wiring pattern is illustrated, and only the second lower surface pad 224 of the second lower surface wiring pattern is illustrated in FIGS. 1A and 1B for convenience of illustration, it may be obvious to those skilled in the art that the support wiring structure 100 may include a portion of the first upper surface wiring pattern extending along a portion between the at least one first base insulating layer 110 and the first upper surface solder resist layer 132 and/or a portion of the first lower surface wiring pattern extending along a portion between the at least one first base insulating layer 110 and the first lower surface solder resist layer 134, or the interposer 200 may further include a portion extending along a portion between the at least one second base insulating layer 210 and the second upper surface solder resist layer 232 and/or a portion of the second lower surface wiring pattern along a portion between the at least one second base insulating layer 210 and the second lower surface solder resist layer 234.

The interposer 200 may include a central portion 201 and an outer portion 203. The central portion 201 and the outer portion 203 of the interposer 200 may refer to different portions of the interposer 200, and the central portion 201 and the outer portion 203 of the interposer 200 may be connected to each other. For example, the central portion 201 of the interposer 200 may be a portion disposed on the semiconductor chip 10. The semiconductor chip 10 may overlap the central portion 201 of the interposer 200 in the vertical direction (the Z direction) perpendicular to the upper surface of the semiconductor chip 10. The outer portion 203 of the interposer 200 is a portion to which the connection structure 162 is attached and may be a portion on which the second lower surface pad 224 connected to the connection structure 162 is disposed.

The outer portion 203 of the interposer 200 may protrude downwardly (e.g., in a direction toward the inactive surface of the semiconductor chip 10) with respect to the central portion 201 of the interposer 200. For example, a lower surface of the outer portion 203 of the interposer 200 may protrude downwardly with respect to a lower surface of the central portion 201 of the interposer 200. In embodiments, a protruding shape of the outer portion 203 of the interposer 200 may be generally achieved by disposing the second lower surface solder resist layer 234 at the outer portion 203 and disposing a thicker portion of the second base insulating layer 210 at the outer portion 203.

According to an embodiment, an upper surface 10TS of the semiconductor chip 10 may be located on a level lower than a lower surface 203BS of the outer portion 203 of the interposer 200. For example, a vertical distance from a lower surface 201BS of the central portion 201 of the interposer 200 to the upper surface 10TS of the semiconductor chip 10 may be greater than a vertical distance from the lower surface 201BS of the central portion 201 of the interposer 200 to a lower surface 203BS of the outer portion 203. Also, an upper surface 201TS of the central portion 201 of the interposer 200 may be located on the same level as a level of the upper surface 203TS of the outer portion 203 of the interposer 20.

According to an embodiment, the number of wiring layers disposed at the outer portion 203 of the interposer 200 may be greater than the number of wiring layers disposed at the central portion 201 of the interposer 200. In addition, the second lower surface solder resist layer 234 may not be disposed at the central portion 201 of the interposer 200, and the second lower surface solder resist layer 234 may be disposed only at the outer portion 203 of the interposer 200.

The central portion 201 of the interposer 200 may have a first thickness T1 in the vertical direction (the Z direction), and the outer portion 203 of the interposer 200 may have a second thickness T2 in the vertical direction (the Z direction). The first thickness T1 may be a distance between the upper surface 201TS and the lower surface 201BS of the central portion 201 of the interposer 200, and the second thickness T2 may be a distance between the upper surface 203TS and the lower surface 203BS of the outer portion 203 of the interposer 200. In embodiments, the first thickness T1 of the central portion 201 of the interposer 200 may be between about 50 μm and about 90 μm. In embodiments, the second thickness T2 of the outer portion 203 of the interposer 200 may be between about 70 μm and about 150 μm.

In embodiments, the second thickness T2 of the outer portion 203 of the interposer 200 may be greater than the first thickness T1 of the central portion 201 of the interposer 200. For example, a difference between the second thickness T2 of the outer portion 203 of the interposer 200 and the first thickness T1 of the central portion 201 of the interposer 200 may be between about 20 μm to about 60 μm. For example, when the first thickness T1 of the central portion 201 of the interposer 200 is 70 μm, the outer portion 203 of the interposer 200 may be formed to have the second thickness T2 between 120 μm and 130 μm.

In embodiments, a first width W1, which is a horizontal width of the central portion 201 of the interposer 200, may be about 10 mm to about 20 mm, and a second width W2, which is a horizontal width of the outer portion 203 of the interposer 200, may be about 0.2 mm to about 2 mm.

As the outer portion 203 of the interposer 200 is formed to protrude with respect to the central portion 201, the interposer 200 may have a recess portion 200RC defined by a side surface of the outer portion 203 on the lower surface of the central portion 201. For example, the interposer 200 may have the recess portion 200RC on the lower surface thereof facing the active surface of the semiconductor chip 10. The recess portion 200RC may be defined as a space formed by recessing the lower surface 201BS of the central portion 201 of the interposer 200 from the lower surface 203BS of the outer portion 203 of the interposer 200. For example, a third thickness T3 of the recess portion 200RC may be between about 20 μm and about 60 μm. For example, a ratio of the third thickness T3 of the recess portion 200RC to the second thickness T2 of the outer portion 203 of the interposer 200 may be about 30% to about 70%.

In some embodiments, the recess portion 200RC may have a planar rectangular shape, when viewed in plan view. A horizontal area of the recess portion 200RC may be greater than a horizontal area of the semiconductor chip 10. Each side surface of the recess portion 200RC of the interposer 200 may not overlap the semiconductor chip 10 in a vertical direction (the Z direction) planarly. For example, the horizontal area of the recess portion 200RC may entirely overlap the horizontal area of the semiconductor chip 10 in the vertical direction (the Z direction).

A method of forming the interposer 200 having the recess portion 200RC is as follows. First, after at least one second base insulating layer 210 is prepared, a plurality of second wiring patterns 220 may be disposed on the second base insulating layer 210. The plurality of second wiring patterns 220 may be embedded or plated in the second base insulating layer 210. Thereafter, the second base insulating layer 210 may be etched to form the recess portion 200RC. Thereafter, the interposer 200 having the recess portion 200RC may be formed by coating a solder resist layer on the surface of the second base insulating layer 210.

The semiconductor package 1 may include a plurality of external connection terminals 150 attached to the first lower surface pads 124. For example, a height of each of the external connection terminals 150 may be about 150 μm. For example, the external connection terminals 150 may be solder balls.

The semiconductor package 1 may include a metal plate 250 engaged with a side surface of the recess portion 200RC of the interposer 200. In addition, the metal plate 250 may be engaged with a bent portion of the lower surface of the interposer 200. For example, the metal plate 250 may be disposed along a portion of the surface of the recess portion 200RC inside the interposer 200. In addition, the metal plate 250 may extend along the side surface of the outer portion 203 of the interposer 200 and the lower surface of the central portion 201. In example embodiments, the lowermost surface of the metal plate 250 may contact an upper surface of the second lower surface solder resist layer 234, and inner and lower surfaces of the metal plate 250 may contact side and top surfaces of the filling member 164.

The metal plate 250 may include copper, nickel, stainless steel, or beryllium copper. In some embodiments, the metal plate 250 may include the same material as that of the second wiring pattern 220. In another embodiment, the metal plate 250 may include a material different from that of the second wiring pattern. In some embodiments, the metal plate 250 may be formed by the same process as that of forming at least some of the second wiring patterns 220. In another embodiment, the metal plate 250 may be formed by a process different from that of the second wiring pattern 220.

The lowermost surface of the metal plate 250 may be disposed on a vertical level higher than that of the lower surface 203BS of the outer portion 203 of the interposer 200. For example, a surface of the metal plate 250 having a concavo-convex shape, located on the lowermost vertical level, may be disposed on a vertical level higher than that of the lower surface 203BS of the outer portion 203 of the interposer 200. In addition, the surface of the metal plate 250 having a concavo-convex shape, located on the lowermost vertical level, may be disposed substantially on the same vertical level as that of the lower surface of the second base insulating layer 210 at the lowermost end of the outer portion 203. In addition, a surface of the metal plate 250 having a concavo-convex shape, located on the uppermost vertical level, may be disposed substantially on the same level as that of the lower surface 201BS of the central portion 201 of the interposer 200. In addition, the surface of the metal plate 250 having a concavo-convex shape, located on the uppermost vertical level, may be disposed substantially on the same vertical level as that of the upper surface of the recess portion 200RC. Also, the upper surface of the metal plate 250 may be disposed on a vertical level higher than the upper surface 201TS of the central portion 201 of the interposer 200. Also, a horizontal area of a space defined by an outer surface of the metal plate 250 may be larger than each of a horizontal area of the semiconductor chip 10 and a horizontal area of the central portion 201 of the interposer 200. For example, a fourth thickness T4 from the uppermost surface to the lowermost surface of the metal plate 250 may be between about 20 μm and about 40 μm. In addition, a fifth thickness T5 from the uppermost surface of the metal plate 250 to the highest surface in the concavo-convex surface of the metal plate 250 may be between about 1 μm and about 20 μm. For example, a distance from the uppermost surface of the metal plate 250 to the lower surface of the second base insulating layer 210 at the lowermost end of the central portion 201 of the interposer 200 may be between about 1 μm and about 30 μm.

A third width W3 of the metal plate 250 may be about 50 μm to about 1000 μm. For example, a ratio of the third width W3 of the metal plate 250 to the first width W1 of the central portion 201 of the interposer 200 may be about 0.5% to about 10%.

The metal plate 250 may have a cavity 250CV through which a vicinity of a center thereof is penetrated planarly. In some embodiments, the cavity 250CV may have a rectangular shape planarly. A horizontal area of the cavity 250CV may have a value greater than a horizontal area of the semiconductor chip 10. Also, a horizontal area of the cavity 250CV may have a value smaller than the horizontal area of the central portion 201 of the interposer 200. A side surface of the cavity 250CV may not be vertically aligned with the semiconductor chip 10.

In the semiconductor package 1 according to the inventive concept, a metal plate 250 engaged with a corner of the recess portion 200RC may be disposed inside the interposer 200 to prevent cracking of the semiconductor package 1. In particular, the metal plate 250 engaged with the corner of the recess portion 200RC may be disposed inside the interposer 200, thereby preventing cracking that occurs along the side surface of the outer portion 203 of the interposer 200. Therefore, in order to form a package-on-package, the structural reliability, thermal characteristics, electrical connection reliability with an upper package attached on the semiconductor package 1 and/or electrical connection reliability with an external system to which the semiconductor package 1 is attached may be improved through the external connection terminals 150.

Figure 2A:
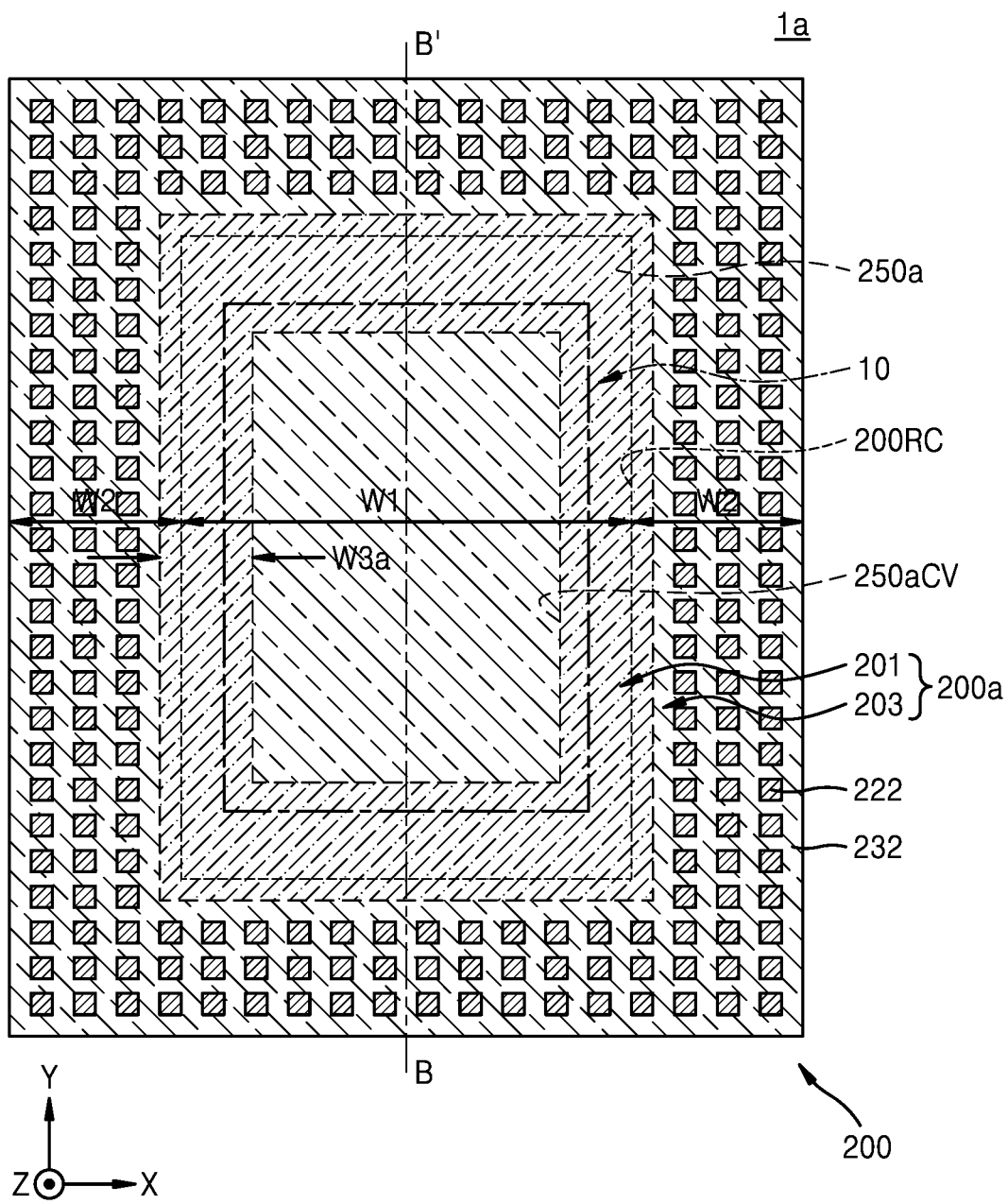
FIG. 2A is a top view of a semiconductor package according to an example embodiment.
Figure 2B:
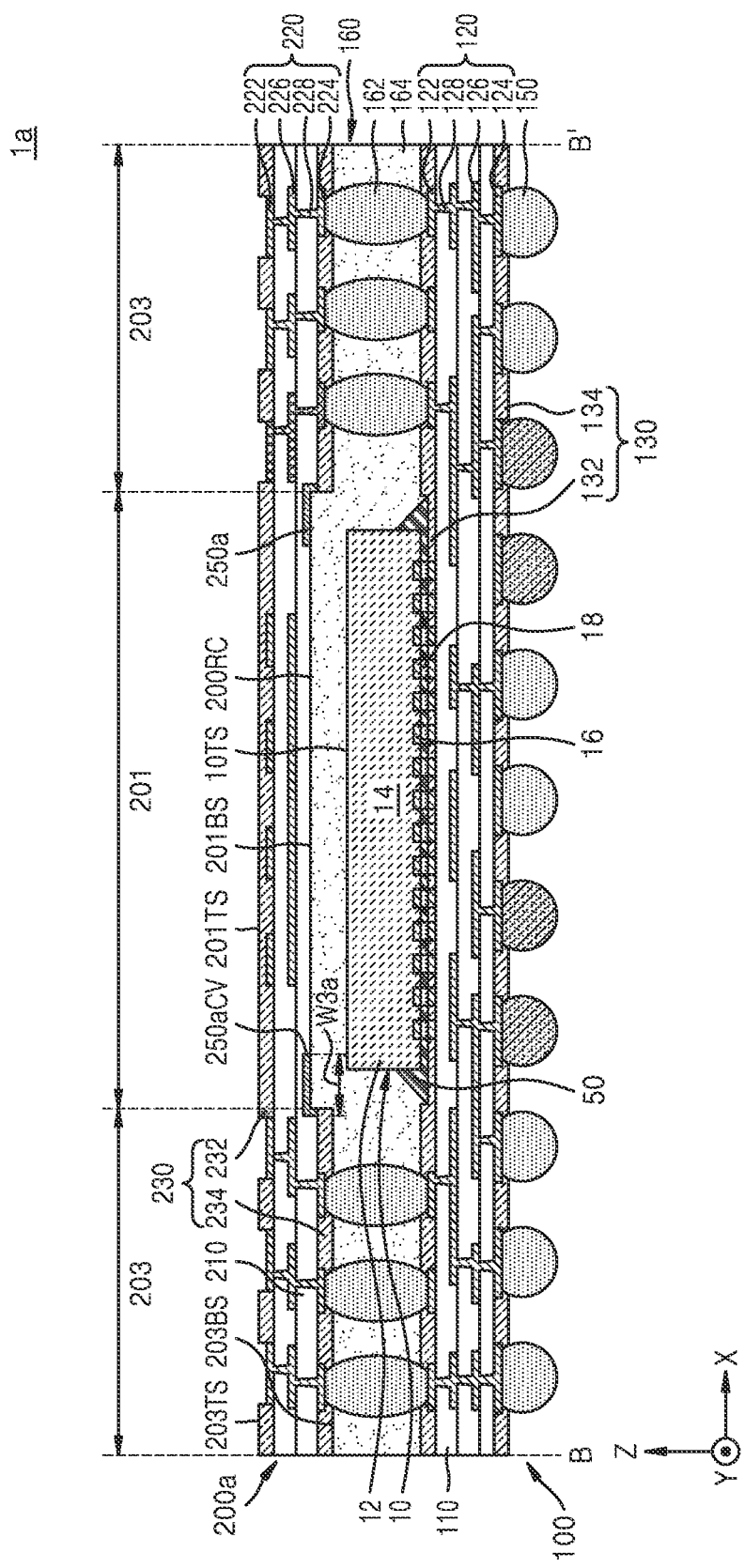
FIG. 2B is a cross-sectional view of the semiconductor package of FIG. 2A according to an example embodiment.

FIG. 2A is a top view of a semiconductor package 1a according to example embodiments, and FIG. 2B is a cross-sectional view of a semiconductor package according to example embodiments, taken along line B-B of FIG. 2A. For convenience of description, illustration of the second upper surface pads 222 disposed on the recess portion 200RC of the interposer 200a is omitted. In FIGS. 2A and 2B, the same reference numerals as those of FIGS. 1A and 1B denote the same components, and redundant descriptions thereof are omitted.

Referring to FIGS. 1A to 2B, the semiconductor package 1a includes a metal plate 250a inside the interposer 200a. The metal plate 250a may have a cavity 250aCV through which a vicinity of a center thereof is penetrated planarly. In some embodiments, the cavity 250aCV may have a planar rectangular shape, when viewed in plan view. A horizontal area of the cavity 250aCV may have a value smaller than a horizontal area of the semiconductor chip 10. A side surface of the cavity 250aCV may not overlap a side surface of the semiconductor chip 10 in the vertical direction (the Z direction), but may overlap a remaining inner portion of the semiconductor chip 10 in the vertical direction (the Z direction) planarly. A third width W3a of the metal plate 250a may be about 1000 μm to about 2500 μm. Twice the third width W3a of the metal plate 250a may be less than the first width W1 of the central portion 201 of the interposer 200a. For example, a ratio of the third width W3a of the metal plate 250 to the first width W1 of the central portion 201 of the interposer 200a may be about 10% to about 25%.

Figure 3:
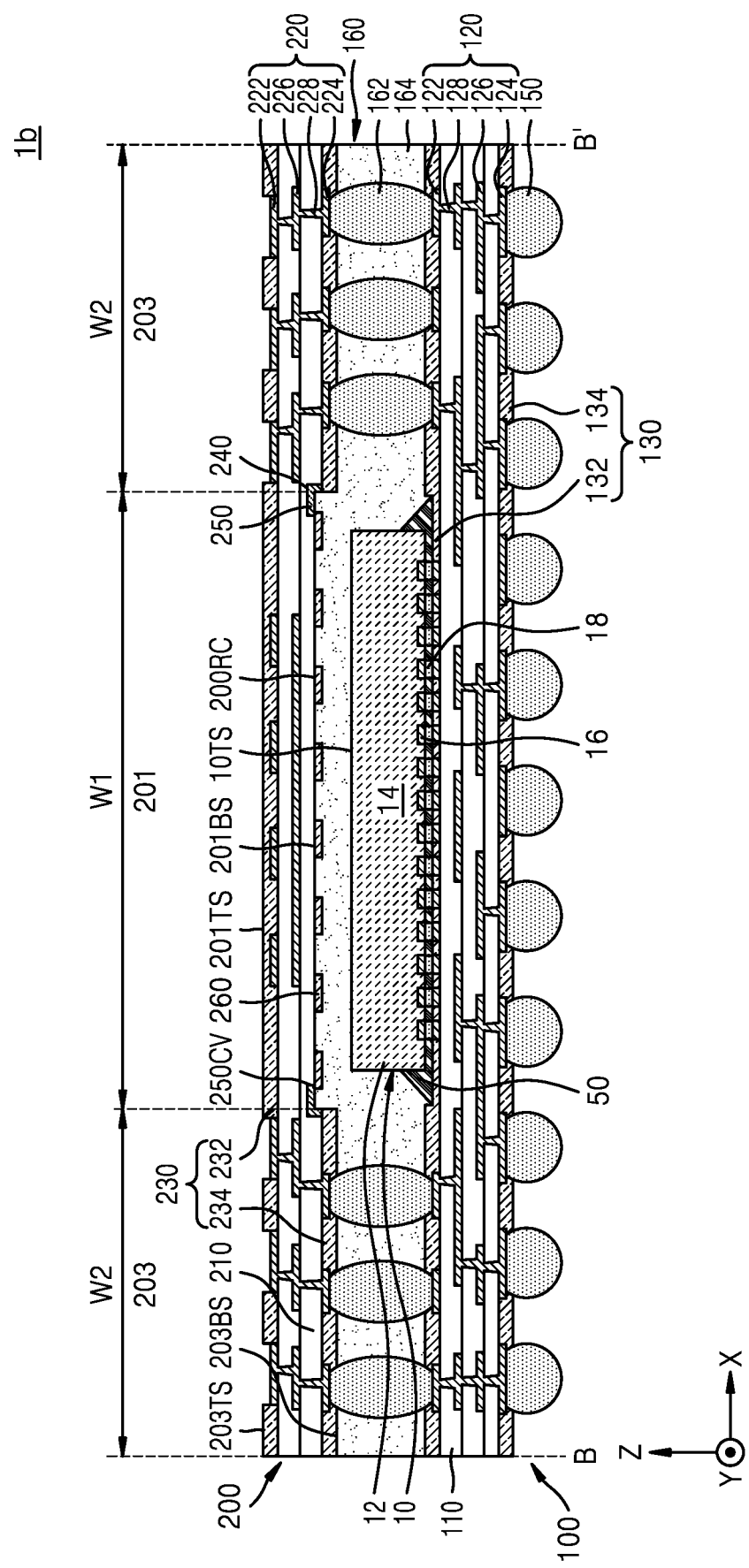
FIG. 3 is a cross-sectional view of a semiconductor package according to example embodiments.

FIG. 3 is a cross-sectional view of a semiconductor package 1b according to example embodiments. In FIG. 3, the same reference numerals as those of FIGS. 1A and 1B denote the same components, and redundant descriptions thereof are omitted.

The semiconductor package 1b of FIG. 3 may include a support wiring structure 100, an expanded layer 160 disposed on the support wiring structure 100, a semiconductor chip 10 disposed in the expanded layer 160, an interposer 200 disposed on the expanded layer 160, and a solder resist (SR) patch 260 disposed on a lower surface of the interposer 200.

The SR patch 260 may have a pillar shape protruding downwardly from a lower surface of the second base insulating layer 210 at the lowermost end in the central portion 201 of the interposer 200 toward the upper surface 10TS of the semiconductor chip 10. An upper surface of the SR patch 260 may contact the lower surface of the second base insulating layer 210. The upper surface of the SR patch 260 may be located on a vertical level, which is substantially the same vertical level as that of the upper surface of the recess portion 200RC. In some embodiments, the upper surface of the SR patch 260 may contact a lower surface of the metal plate 250.

In embodiments, a plurality of SR patches 260 may be disposed on a lower surface of the interposer 200. For example, as shown in FIG. 3, the SR patches 260 may be located in the recess portion 200RC and may be arranged in a two-dimensional array form on a lower surface of the second base insulating layer 210 at the lowermost end in the central portion 201 of the interposer 200. For example, the SR patches 260 may be spaced apart from each other in a row. In example embodiments, the plurality of SR patches 260 may contact the lower surface 201BS of the central portion 201 of the second base insulating layer 210. A lower surface of each of the SR patches 260 may be disposed to be spaced apart from the upper surface 10TS of the semiconductor chip 10 in a vertical direction (the Z direction). For example, a vertical distance between the lower surface 201BS of the central portion 201 of the interposer 200 and the upper surface LOTS of the semiconductor chip 10 may be greater than a thickness of the SR patch 260. In addition, the lower surface and sidewalls of each of the SR patches 260 may be covered by the filling member 164. For example, the filling member 164 may contact the lower surface and sidewalls of each of the SR patches 260.

In embodiments, the SR patch 260 may include the same material as that of the second lower surface solder resist layer 234. For example, the SR patch 260 may include solder resist. For example, in order to form the SR patch 260, a solder resist material layer covering the lower surface of the second base insulating layer 210 may be formed, and a patterning process may be performed on the solder resist material layer to simultaneously form the second lower surface solder resist layer 234 and the SR patch 260.

In embodiments, the SR patch 260 may include a material different from that of the second lower surface solder resist layer 234. For example, the second lower surface solder resist layer 234 may include a solder resist, and the SR patch 260 may include an epoxy-based resin or a polyimide-based resin. For example, the SR patch 260 may be formed by attaching a dot-shaped structure to the lower surface of the second base insulating layer 210 at the lowermost end.

Figure 4:
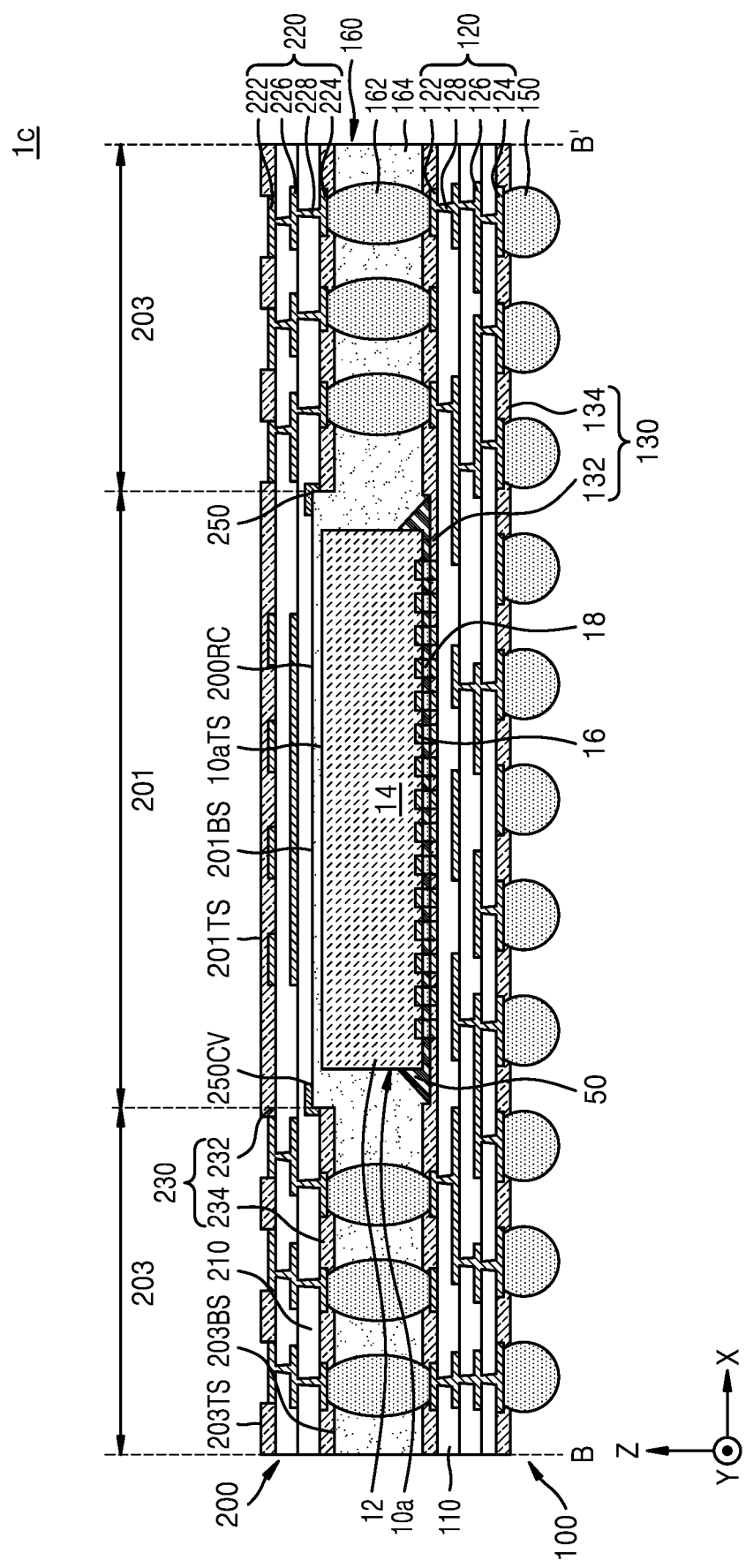
FIG. 4 is a cross-sectional view of a semiconductor package according to example embodiments.

FIG. 4 is a cross-sectional view of a semiconductor package 1c according to example embodiments. In FIG. 4, the same reference numerals as those of FIGS. 1A and 1B denote the same components, and redundant descriptions thereof are omitted.

The semiconductor package 1c of FIG. 4 may include a support wiring structure 100, an expanded layer 160 disposed on the support wiring structure 100, a semiconductor chip 10a disposed in the expanded layer 160, and an interposer 200 disposed on the expanded layer 160.

In the semiconductor package 1c of FIG. 4, a portion of the semiconductor chip 10a may be accommodated in the recess portion 200RC of the interposer 200. An upper surface 10aTS of the semiconductor chip 10a may be located on a vertical level higher than that of a lower surface 203BS of the outer portion 203 of the interposer 200, and may be located on a vertical level lower than that of the lower surface 201BS of the central portion 201 of the interposer 200. For example, a vertical distance between the lower surface 201BS of the central portion 201 of the interposer 200 and the upper surface 10aTS of the semiconductor chip 10a may be less than a vertical distance between the lower surface 201BS of the central portion 201 of the interposer 200 and the lower surface 203BS of the outer portion 203 of the interposer 200.

FIGS. 5 to 8 are cross-sectional views of a package-on-package having a semiconductor package according to example embodiments.

Figure 5:
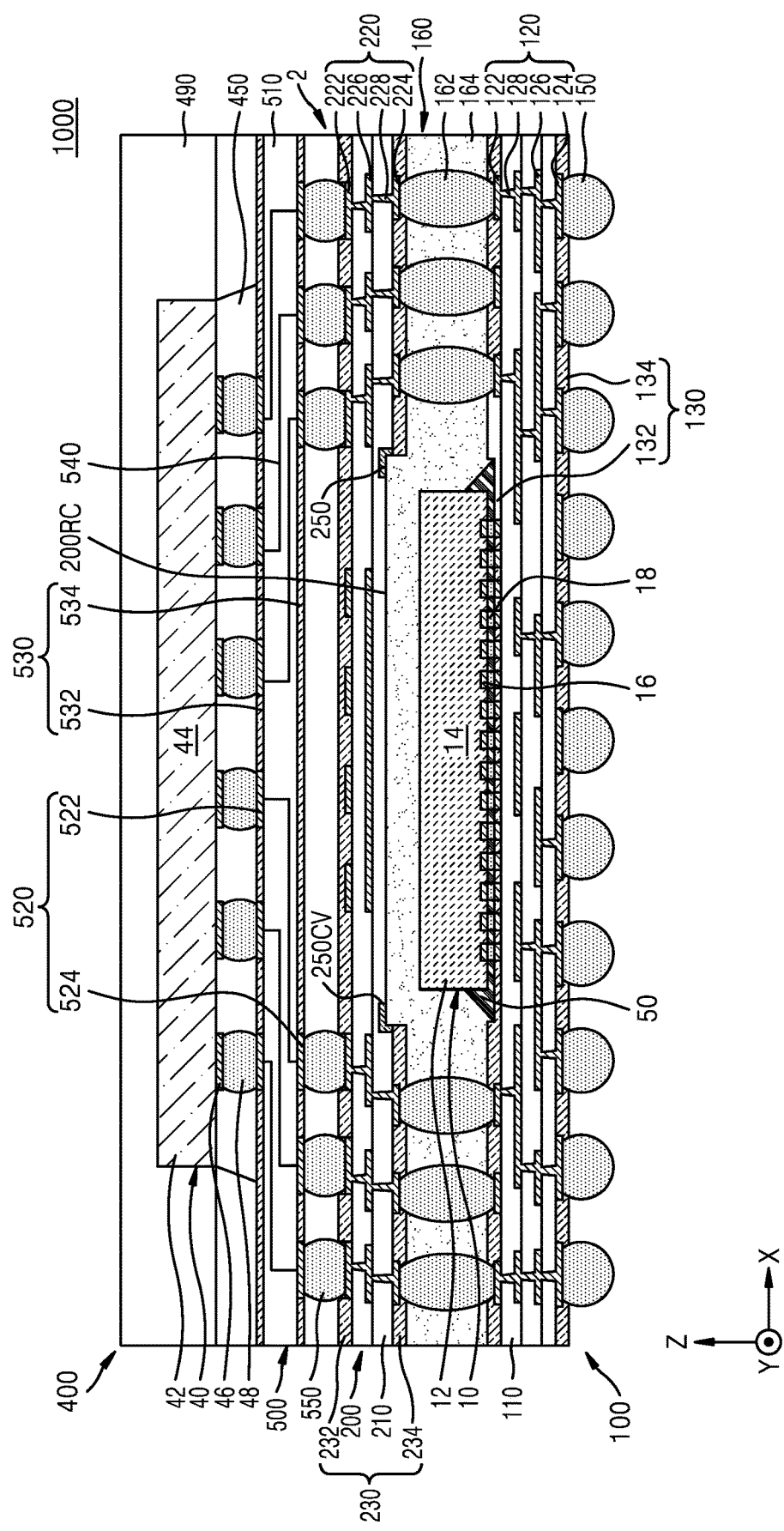
FIG. 5 is a cross-sectional view of a package-on-package having a semiconductor package according to example embodiments.

Referring to FIG. 5, the package-on-package 1000 includes a second semiconductor package 400 stacked on a first semiconductor package 2. The first semiconductor package 2 may be a lower semiconductor package, and the second semiconductor package 400 may be an upper semiconductor package. A first semiconductor package 2, a first semiconductor chip 10, a first semiconductor substrate 12, a first semiconductor device 14, a first chip connection pad 16, a first chip connection terminal 18, and a first underfill layers 50 are substantially the same as the semiconductor package 1, the semiconductor chip 10, the semiconductor substrate 12, the semiconductor device 14, the chip connection pad 16, the chip connection terminal 18, and the underfill layer 50, respectively, described above with reference to FIGS. 1A and 1B, and thus, detailed descriptions thereof are omitted.

The second semiconductor package 400 may include at least one second semiconductor chip 40. The second semiconductor package 400 may be electrically connected to the first semiconductor package 2 through a plurality of package connection terminals 550 attached to the second upper pads 222 of the first semiconductor package 2 exposed without being covered by the second upper solder resist layer 232.

The second semiconductor chip 40 may include a second semiconductor substrate 42 having a second semiconductor device 44 formed on an active surface thereof and a plurality of second chip connection pads 46 disposed on the active surface of the second semiconductor substrate 42. The second semiconductor substrate 42, the second semiconductor device 44, and the second chip connection pad 46 are substantially the same as the semiconductor substrate 12, the semiconductor device 14, and the chip connection pad 16, respectively, described above with reference to FIGS. 1A and 1B, and thus, redundant descriptions thereof are omitted.

At least one second semiconductor chip 40 may be a memory semiconductor chip. The second semiconductor chip 40 may be, for example, a DRAM chip, an SRAM chip, a flash memory chip, an EEPROM chip, a PRAM chip, an MRAM chip, or a RRAM chip.

In FIG. 5, at least one second semiconductor chip 40 included in the second semiconductor package 400 is illustrated as being mounted on a package base substrate 500 in a flip-chip manner, but the inventive concept is not limited thereto. The package-on-package 1000 may include, as an upper semiconductor package, any type of semiconductor package including at least one second semiconductor chip 40, in which the package connection terminal 550 may be attached to a lower side thereof to be electrically connected to the first semiconductor package 2.

The package base substrate 500 may include a base board layer 510 and a plurality of board pads 520 disposed on upper and lower surfaces of the base board layer 510. The board pads 520 may include a plurality of board upper surface pads 522 disposed on an upper surface of the base board layer 510 and a plurality of board lower surface pads 524 disposed on a lower surface of the base board layer 510. In some embodiments, the package base substrate 500 may be a PCB. For example, the package base board 500 may be a multi-layer PCB. The base board layer 510 may include at least one material selected from phenol resin, epoxy resin, and polyimide.

A board solder resist layer 530 exposing the board pads 520 may be formed on the upper and lower surfaces of the base board layer 510. The board solder resist layer 530 may include an upper board solder resist layer 532 covering the upper surface of the base board layer 510 and exposing the board upper surface pads 522 and a lower surface board solder resist layer 534 covering the lower surface of the base board layer 510 and exposing the board lower surface pads 524.

The package base substrate 500 may include a board wiring 540 electrically connecting the board upper surface pads 522 and the board lower surface pads 524 to each other inside the base board layer 510. The board wiring 540 may include a board wiring line and a board wiring via. The board wiring 540 may include copper, nickel, stainless steel, or beryllium copper. In some embodiments, the board wiring 540 may also be disposed between the upper surface of the base board layer 510 and the upper surface board solder resist layer 532, and/or between the lower surface of the base board layer 510 and the lower surface board solder resist layer 534.

The board upper surface pads 522 may be electrically connected to the second semiconductor chip 40. For example, between the second chip connection pads 46 of the second semiconductor chip 40 and the board upper surface pads 522 of the package base substrate 500, the second chip connection terminals 48 may be disposed to electrically connect the second semiconductor chip 40 to the package base substrate 500. The second chip connection terminals 48 may contact the second chip connection pads 46 of the second semiconductor chip 40 and the board upper surface pads 522 of the package base substrate 500. In some embodiments, a second underfill layer 450 surrounding the second chip connection terminals 48 may be between the second semiconductor chip 40 and the package base substrate 500. The second underfill layer 450 may contact side surfaces of the second chip connection terminals 48, a lower surface of the second semiconductor chip 40, and an upper surface of the package base substrate 500. The second underfill layer 450 may include, for example, an epoxy resin formed by a capillary underfill method. In some embodiments, the second underfill layer 450 may be a non-conductive film.

A molding layer 490 surrounding the second semiconductor chip 40 may be disposed on the package base substrate 500. The molding layer 490 may include, for example, an epoxy mold compound (EMC). In some embodiments, the molding layer 490 may cover a non-active surface of the second semiconductor chip 40. In other embodiments, the molding layer 490 may cover a side surface of the second semiconductor chip 40 but may not cover the non-active surface, and a heat dissipation member may be attached to the non-active surface of the second semiconductor chip 40. In example embodiments, a side surface of the molding layer 490 may be coplanar with a side surface of the package base substrate 500.

Figure 6:
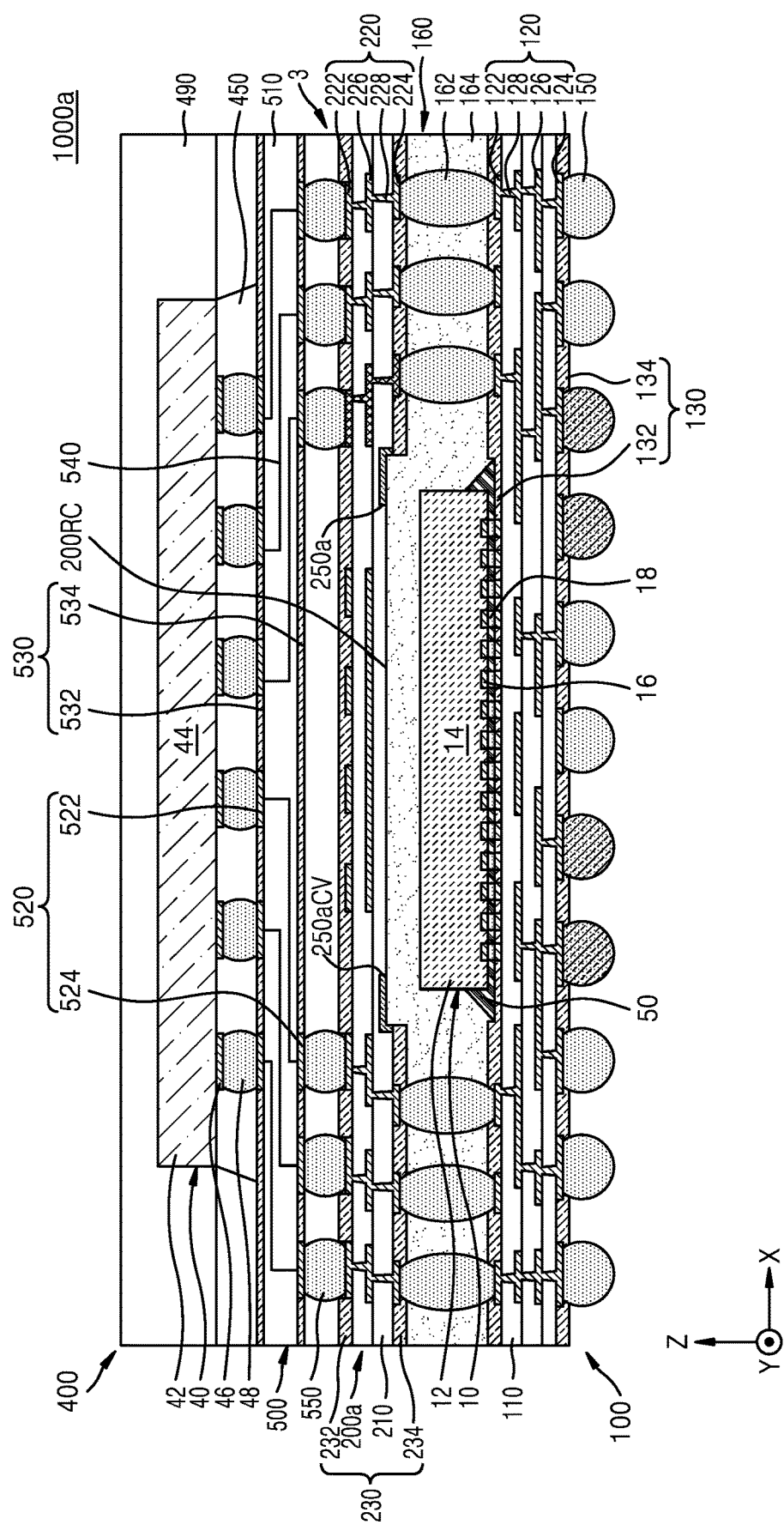
FIG. 6 is a cross-sectional view of a package-on-package having a semiconductor package according to example embodiments.

Referring to FIG. 6, a package-on-package 1000a includes the second semiconductor package 400 stacked on a first semiconductor package 3. The first semiconductor package 3 may be a lower semiconductor package, and the second semiconductor package 400 may be an upper semiconductor package. The first semiconductor package 3 is substantially the same as the semiconductor package 1a described above with reference to FIGS. 2A and 2B, and the second semiconductor package 400 is substantially the same as the second semiconductor package 400 described above with reference to FIG. 5, and thus, detailed descriptions thereof are omitted.

Figure 7:
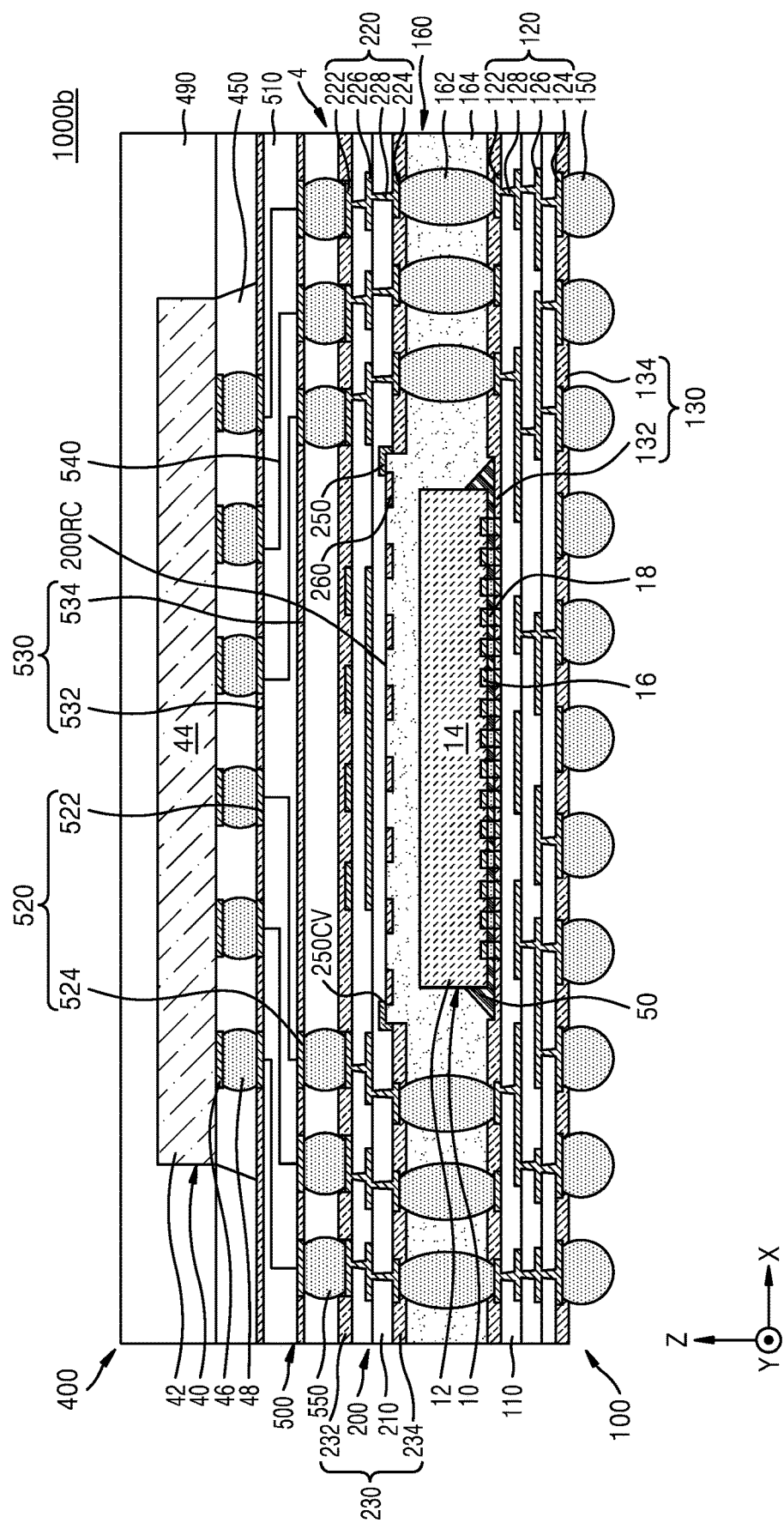
FIG. 7 is a cross-sectional view of a package-on-package having a semiconductor package according to example embodiments.

Referring to FIG. 7, a package-on-package 1000b includes the second semiconductor package 400 stacked on a first semiconductor package 4. The first semiconductor package 4 may be a lower semiconductor package, and the second semiconductor package 400 may be an upper semiconductor package. The first semiconductor package 4 is substantially the same as the semiconductor package 1b described above with reference to FIG. 3, and the second semiconductor package 400 is substantially the same as the second semiconductor package 400 described above with reference to FIG. 5, and thus, detailed descriptions thereof are be omitted.

Figure 8:
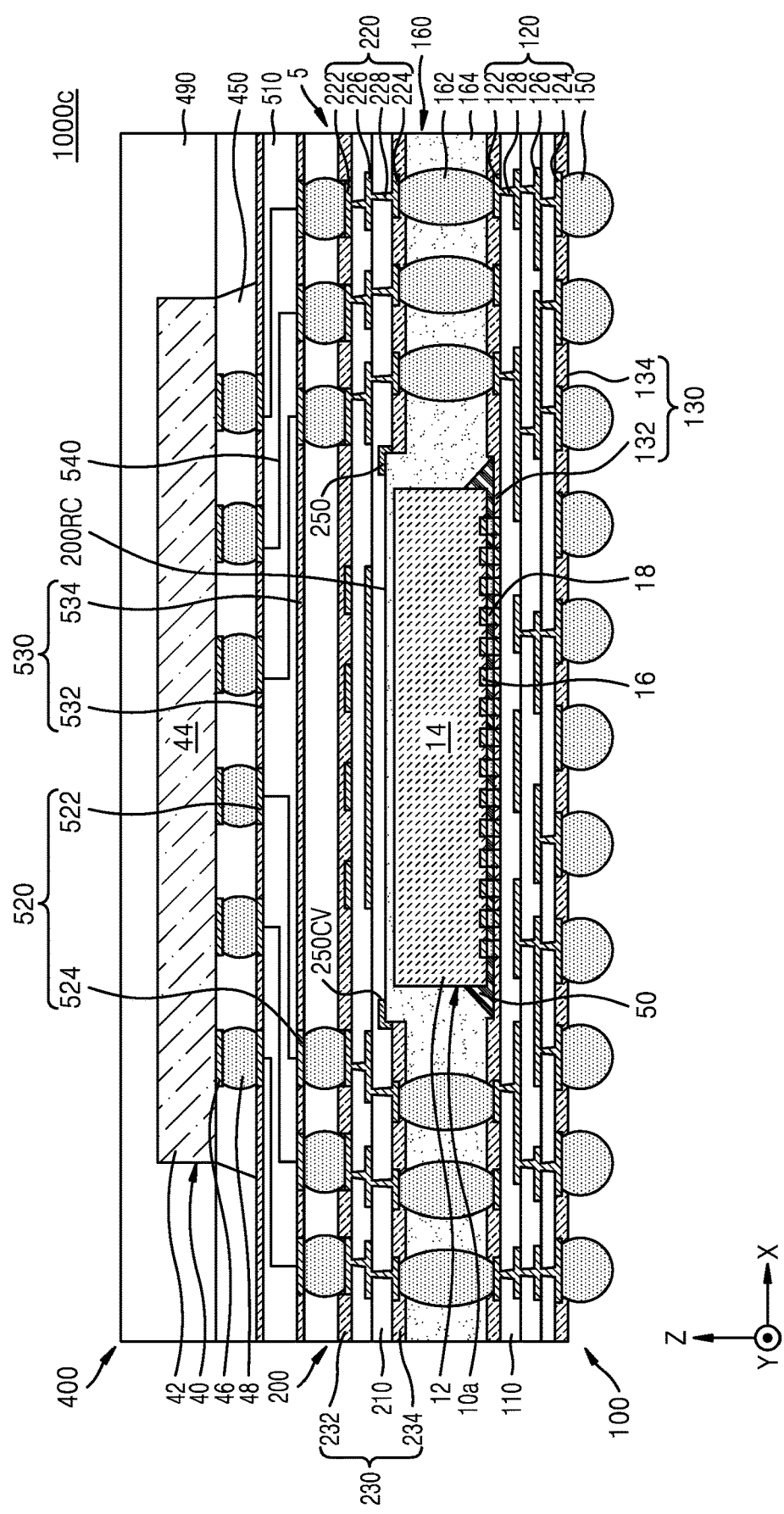
FIG. 8 is a cross-sectional view of a package-on-package having a semiconductor package according to example embodiments.

Referring to FIG. 8, a package-on-package 1000c includes the second semiconductor package 400 stacked on a first semiconductor package 5. The first semiconductor package 5 may be a lower semiconductor package, and the second semiconductor package 400 may be an upper semiconductor package. The first semiconductor package 5 is substantially the same as the semiconductor package 1c described above with reference to FIG. 4, and the second semiconductor package 400 is substantially the same as the second semiconductor package 400 described above with reference to FIG. 5, and thus, detailed descriptions thereof are omitted.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

While the inventive concept has been particularly shown and described with reference to embodiments thereof, it will be understood that various changes in form and details may be made therein without departing from the spirit and scope of the following claims.

What is claimed is:

1. A semiconductor package comprising:
a support wiring structure;
a semiconductor chip on the support wiring structure;
a connection structure on the support wiring structure and spaced apart from the semiconductor chip in a horizontal direction;
an interposer including a central portion and an outer portion and having a recess portion provided on a lower surface of the central portion facing the semiconductor chip, wherein the central portion is on the semiconductor chip and the connection structure is attached to the outer portion; and
a metal plate disposed along a portion of a surface of the recess portion inside the interposer,
wherein the metal plate extends along a side surface of the outer portion of the interposer and the lower surface of the central portion of the interposer, and
wherein the metal plate has a cavity passing through a vicinity of a center of the metal plate,
wherein a lowermost surface of the metal plate is at a higher vertical level than an upper surface of the semiconductor chip.

2. The semiconductor package of claim 1, wherein each side surface of the cavity does not overlap each side surface of the semiconductor chip in a vertical direction, and is located outside the semiconductor chip in the horizontal direction, relative to the side surface of the semiconductor chip.

3. The semiconductor package of claim 1, wherein each side surface of the cavity does not overlap a side surface of the semiconductor chip in a vertical direction, and overlaps a remaining inner portion of the semiconductor chip in the vertical direction.

4. The semiconductor package of claim 1,
wherein a highest surface of a concavo-convex surface of the metal plate is disposed on a vertical level that is the same as a vertical level of the lower surface of the central portion of the interposer, and
wherein a lowest surface of the concavo-convex surface of the metal plate is disposed on a vertical level higher than a vertical level of a lower surface of the outer portion of the interposer.

5. The semiconductor package of claim 1, wherein, in a plan view, an inner space defined by an outer surface of the metal plate and the cavity of the metal plate have a rectangular shape.

6. The semiconductor package of claim 1, wherein an upper surface of the outer portion of the interposer and an upper surface of the central portion of the interposer are located on substantially the same vertical level.

7. The semiconductor package of claim 1, wherein a horizontal area of the recess portion is greater than a horizontal area of the semiconductor chip.

8. A semiconductor package comprising:
a support wiring structure;
a semiconductor chip on the support wiring structure;

a connection structure on the support wiring structure and spaced apart from the semiconductor chip in a horizontal direction;

an interposer including a central portion and an outer portion, and having a recess portion provided on a lower surface of the central portion facing the semiconductor chip, wherein the central portion is disposed on the semiconductor chip and the connection structure is attached to the outer portion; and a metal plate disposed along a portion of a surface of the recess portion inside the interposer, wherein the interposer includes at least one base insulating layer, a plurality of upper surface pads and a plurality of lower surface pads respectively disposed on upper and lower surfaces of the at least one base insulating layer, an upper surface solder resist layer covering the upper surface of the at least one base insulating layer and exposing the plurality of upper surface pads, and a lower surface solder resist layer covering a portion of the lower surface of the at least one base insulating layer and exposing the plurality of lower surface pads, wherein the metal plate has a cavity passing through a vicinity of a center of the metal plate, wherein the metal plate extends along a side surface of the outer portion of the interposer and the lower surface of the central portion of the interposer, and wherein a highest surface of a concavo-convex surface of the metal plate is disposed on a vertical level that is the same as a vertical level of the lower surface of the central portion of the interposer.

9. The semiconductor package of claim 8, wherein a lowermost surface of the metal plate is located on substantially the same vertical level as a vertical level of the upper surface of the lower surface solder resist layer.

10. The semiconductor package of claim 8, wherein, in a plan view, each side surface of the recess portion does not overlap each side surface of the semiconductor chip in a vertical direction, and is located outside the semiconductor chip in the horizontal direction, relative to the side surface of the semiconductor chip.

11. The semiconductor package of claim 8, further comprising:

a solder resist (SR) patch disposed on the lower surface of the at least one base insulating layer at the lowermost end of the central portion of the interposer.

12. The semiconductor package of claim 11, wherein a lower surface of the SR patch and the upper surface of the semiconductor chip are vertically spaced apart from each other.

13. The semiconductor package of claim 8, wherein the lower surface solder resist layer is disposed only on the lower surface of the outer portion of the interposer.

14. The semiconductor package of claim 8, wherein, in a plan view, the metal plate is disposed on only a portion of the central portion of the interposer.

15. The semiconductor package of claim 8, wherein the upper surface of the semiconductor chip is located on a vertical level lower than a vertical level of the lower surface of the outer portion of the interposer.

16. The semiconductor package of claim 8, wherein the upper surface of the semiconductor chip is located on a vertical level higher than a vertical level of the lower surface of the outer portion of the interposer and located on a vertical level lower than a vertical level of the upper surface of the recess portion of the interposer.

17. A package-on-package comprising:

a first support wiring structure;

a first semiconductor chip on the first support wiring structure;

a first connection structure on the first support wiring structure and spaced apart from the first semiconductor chip in a horizontal direction;

an interposer including a central portion and an outer portion and having a recess portion provided on a lower surface of the central portion facing the first semiconductor chip, wherein the central portion is on the first semiconductor chip and the first connection structure is attached to the outer portion;

an insulating filler filling a portion between the first support wiring structure and the interposer and contacting the first semiconductor chip and the first connection structure;

a metal plate disposed along a portion of a surface of the recess portion inside the interposer;

a second connection structure disposed on es the outer portion of the interposer;

a second support wiring structure disposed on the interposer through the second connection structure; and a second semiconductor chip disposed on the second support wiring structure, wherein the metal plate extends along a side surface of the outer portion of the interposer and the lower surface of the central portion of the interposer, wherein a highest surface of a concavo-convex surface of the metal plate is disposed on a vertical level that is the same as a vertical level of the lower surface of the central portion of the interposer, and wherein a portion of an upper surface of the recess portion is not in contact with the metal plate.

18. The package-on-package of claim 17, wherein a range of a ratio of a horizontal width of the metal plate to a horizontal width of the central portion of the interposer is about 2% to about 25%.

19. The package-on-package of claim 17, wherein a range of a vertical distance from an upper surface of the metal plate to the highest surface of the concavo-convex surface of the metal plate is about 1 micrometer to about 20 micrometers.

20. The package-on-package of claim 17, wherein a ratio of a thickness of the recess portion to a thickness of the outer portion of the interposer is about 30% to about 70%.

* * * * *